(12) United States Patent
Xuan et al.

(10) Patent No.: US 11,475,831 B2
(45) Date of Patent: Oct. 18, 2022

(54) DISPLAY PANEL, METHOD OF DRIVING DISPLAY PANEL, AND DISPLAY DEVICE

(71) Applicant: BOE TECHNOLOGY GROUP CO., LTD., Beijing (CN)

(72) Inventors: Minghua Xuan, Beijing (CN); Lei Wang, Beijing (CN); Li Xiao, Beijing (CN); Xiaochuan Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 643 days.

(21) Appl. No.: 16/345,854

(22) PCT Filed: Nov. 1, 2018

(86) PCT No.: PCT/CN2018/113467
§ 371 (c)(1),
(2) Date: Apr. 29, 2019

(87) PCT Pub. No.: WO2019/200890
PCT Pub. Date: Oct. 24, 2019

(65) Prior Publication Data
US 2021/0390904 A1  Dec. 16, 2021

(30) Foreign Application Priority Data

Apr. 19, 2018 (CN) .......................... 201810355181.8

(51) Int. Cl.
*G09G 3/20* (2006.01)
*G09G 3/3233* (2016.01)
(Continued)

(52) U.S. Cl.
CPC ......... *G09G 3/3225* (2013.01); *G09G 3/3266* (2013.01); *G09G 2300/0439* (2013.01);
(Continued)

(58) Field of Classification Search
CPC ...... G09G 3/32; G09G 3/3255; G09G 3/3266; G09G 2300/0439; G09G 2300/0876;
(Continued)

(56) References Cited

U.S. PATENT DOCUMENTS 9,892,673 B2   2/2018 Hsu
10,339,866 B2  7/2019 Noguchi et al.
(Continued)

FOREIGN PATENT DOCUMENTS

CN  202473182 U  10/2012
CN  104656263 A   5/2015
(Continued)

OTHER PUBLICATIONS

Chinese Office Action in Chinese Application No. 201810355181.8, dated Mar. 3, 2021 with English translation.
(Continued)

*Primary Examiner* — Chanh D Nguyen
*Assistant Examiner* — Nguyen H Truong
(74) *Attorney, Agent, or Firm* — Collard & Roe, P.C.

(57) ABSTRACT

A display panel, a method of driving a display panel, and a display device are provided. The display panel includes a plurality of sub-pixel units arranged in an array, a plurality of compensation driving circuits and a plurality of light emitting control lines; sub-pixel units in each row are divided into a plurality of compensation light emitting groups, the plurality of compensation light emitting groups include a plurality of first compensation light emitting groups, the first compensation light emitting groups each include N sub-pixel units that are adjacent, and light emitting circuits of the N sub-pixel units that are adjacent are connected to one same compensation driving circuit; the light emitting circuits of the N sub-pixel units that are adjacent of each of the first compensation light emitting
(Continued)

groups are respectively connected to N light emitting control lines that are different.

19 Claims, 11 Drawing Sheets

(51) Int. Cl.
 *G09G 3/3225* (2016.01)
 *G09G 3/3266* (2016.01)
(52) U.S. Cl.
 CPC ............ *G09G 2300/0876* (2013.01); *G09G 2310/0205* (2013.01); *G09G 2310/08* (2013.01); *G09G 2340/0457* (2013.01)
(58) Field of Classification Search
 CPC ....... G09G 2310/0205; G09G 2310/08; G09G 2340/0457
 See application file for complete search history.

(56) References Cited

U.S. PATENT DOCUMENTS

| | | | |
|---|---|---|---|
| 10,916,184 | B2 | 2/2021 | Xuan et al. |
| 2006/0007073 | A1* | 1/2006 | Kwak .................. G09G 3/3233 345/76 |
| 2006/0197882 | A1 | 9/2006 | Oh et al. |
| 2011/0260951 | A1 | 10/2011 | Hwang et al. |
| 2012/0313903 | A1 | 12/2012 | Pyon et al. |
| 2013/0207940 | A1 | 8/2013 | Song et al. |
| 2016/0203776 | A1* | 7/2016 | Choo .................. G09G 3/3607 345/694 |
| 2016/0351136 | A1 | 12/2016 | He et al. |
| 2017/0039913 | A1 | 2/2017 | Guo et al. |
| 2018/0130401 | A1* | 5/2018 | Xiang .................. G09G 3/2074 |
| 2018/0130405 | A1* | 5/2018 | Lee ........................ G09G 3/32 |

FOREIGN PATENT DOCUMENTS

| | | |
|---|---|---|
| CN | 104835451 A | 8/2015 |
| CN | 104880874 A | 9/2015 |
| CN | 105093656 A | 11/2015 |
| CN | 106663404 A | 5/2017 |
| CN | 107170408 A | 9/2017 |
| CN | 107610640 A | 1/2018 |

OTHER PUBLICATIONS

International Search Report of PCT/CN2018/113467 in Chinese, dated Feb. 13, 2019 with English Translation.
Notice of Transmittal of the International Search Report of PCT/CN2018/113467 in Chinese, dated Feb. 13, 2019.
International Preliminary Report on Patentability of PCT/CN2018/113467, dated Oct. 20, 2020 and English Translation of the Written Opinion of the International Searching Authority of PCT/CN2018/113467, dated Feb. 13, 2019.
European Search Report in European Patent Application No. 18869467.3 dated Jan. 21, 2022.

* cited by examiner

DISPLAY PANEL, METHOD OF DRIVING DISPLAY PANEL, AND DISPLAY DEVICE

CROSS REFERENCE TO RELATED APPLICATIONS

This application is the National Stage of PCT/CN2018/113467 filed on Nov. 1, 2018, which claims priority under 35 U.S.C. § 119 of Chinese Application No. 201810355181.8 filed on Apr. 19, 2018, the disclosure of which is incorporated by reference.

TECHNICAL FIELD

Embodiments of the present disclosure relate to a display panel, a method of driving a display panel, and a display device.

BACKGROUND

An organic light emitting diode (OLED) display device has gradually attracted widespread attention due to its advantages of wide viewing angle, high contrast ratio, fast response speed, and higher light emitting luminance and lower driving voltage compared with an inorganic light emitting display device. Due to the above characteristics, an organic light emitting diode (OLED) may be applicable to devices having a display function such as mobile phones, displays, notebook computers, digital cameras, instruments and meters, etc.

Pixel circuits in the OLED display device generally adopt a matrix driving mode, which is divided into active matrix (AM) driving mode and passive matrix (PM) driving mode according to whether switching elements are adopted in each pixel unit. Although PMOLED is simple in process and has low cost, it cannot meet requirements of large-scale display with high resolution since it has shortcomings such as cross talk, high power consumption, short lifetime, etc. In contrast, in AMOLED, a group of thin film transistors and storage capacitors are integrated in the pixel circuit of each pixel, and a control of a current flowing through the OLED is implemented, through a driving control of the thin film transistors and the storage capacitors, so that the OLED emits light as required. Compared with the PMOLED, the AMOLED needs less driving currents, and has lower power consumption and longer lifetime, which can meet requirements of the large-scale display with high resolution and multi-grays. Meanwhile, the AMOLED has obvious advantages in respects of viewing angle, color restoration, power consumption, response time, etc., and is applicable to display devices with high information content and high resolution.

SUMMARY

At least one embodiment of the present disclosure provides a display panel, which comprises a plurality of sub-pixel units arranged in an array, a plurality of compensation driving circuits, and a plurality of light emitting control lines. The sub-pixel units each comprise a light emitting circuit, and the array comprises a plurality of rows and a plurality of columns; sub-pixel units in each row are divided into a plurality of compensation light emitting groups, the plurality of compensation light emitting groups comprise a plurality of first compensation light emitting groups, the first compensation light emitting groups each comprise N sub-pixel units that are adjacent, and light emitting circuits of the N sub-pixel units that are adjacent are connected to one same compensation driving circuit for being time-division driven; light emitting circuits of the N sub-pixel units that are adjacent of each of the first compensation light emitting groups are respectively connected to N light emitting control lines that are different; and N is an integer greater than or equal to 2.

For example, the display panel provided by an embodiment of the present disclosure further includes a plurality of gate lines and a plurality of data lines, and each row of the sub-pixel units correspond to N light emitting control lines, and control terminals of the light emitting circuits of N sub-pixel units in each of the first compensation light emitting groups in the row are respectively connected to the N light emitting control lines correspondingly; and each of the compensation driving circuits is connected to one of the gate lines and one of the data lines, respectively.

For example, in the display panel provided by an embodiment of the present disclosure, N=2, and each row of the sub-pixel units correspond to two of the light emitting control lines, which are respectively a first light emitting control line and a second light emitting control line; and in the first compensation light emitting groups of each row of the sub-pixel units, control terminals of light emitting circuits in the sub-pixel units in odd columns are connected to the first light emitting control line, and control terminals of light emitting circuits in the sub-pixel units in even columns are connected to the second light emitting control line.

For example, in the display panel provided by an embodiment of the present disclosure, for a same row of the sub-pixel units, the compensation light emitting groups further comprise at least one of second compensation light emitting groups, the second compensation light emitting groups each includes one of the sub-pixel units, and the light emitting circuit of the one of the sub-pixel units is connected to one of the compensation driving circuits; the compensation driving circuits which are corresponding to the first compensation light emitting groups in different rows corresponding to each other in a column direction are connected to one same data line; and the compensation driving circuits which are corresponding to second compensation light emitting groups in different rows corresponding to each other in the column direction are connected to another one same data line.

For example, in the display panel provided by an embodiment of the present disclosure, in odd rows of the sub-pixel units, the second compensation light emitting group is at a first end in a row direction, in even rows of the sub-pixel units, the second compensation light emitting group is at a second end in the row direction, and the first end and the second end are opposite to each other.

For example, in the display panel provided by an embodiment of the present disclosure, each row of the sub-pixel units correspond to one of the gate lines, and the compensation driving circuits connected to the compensation light emitting groups of the same row of the sub-pixel units are connected to a gate line corresponding to the row.

For example, in the display panel provided by an embodiment of the present disclosure, the gate lines corresponding to a (2m−1)th row and a (2m)th row of the sub-pixel units are configured to receive identical gate scanning signals, and m is an integer greater than or equal to 1.

For example, in the display panel provided by an embodiment of the present disclosure, every adjacent two rows of the sub-pixel units correspond to one same gate line, and the compensation driving circuits connected to the compensation light emitting groups of the adjacent two rows of the sub-pixel units are connected to the same gate line.

For example, in the display panel provided by an embodiment of the present disclosure, the first compensation light emitting groups in different rows are aligned in a column direction.

For example, in the display panel provided by an embodiment of the present disclosure, each row of the sub-pixel units correspond to one of the gate lines, and the compensation driving circuits connected to the compensation light emitting groups of a same row of the sub-pixel units are connected to the one of the gate lines corresponding to the row; and in a column direction, the compensation driving circuits corresponding to the first compensation light emitting groups in odd rows and the compensation driving circuits corresponding to the first compensation light emitting groups in even rows are respectively connected to two different data lines.

For example, in the display panel provided by an embodiment of the present disclosure, each row of the sub-pixel units correspond to one of the gate lines, and the compensation driving circuits connected to the compensation light emitting groups of a same row of the sub-pixel units are connected to the one of the gate lines corresponding to the row; and in a column direction, the compensation driving circuits corresponding to the first compensation light emitting groups in different rows are connected to one same data line.

For example, in the display panel provided by an embodiment of the present disclosure, every adjacent two rows of the sub-pixel units correspond to one same gate line, and the compensation driving circuits connected to the compensation light emitting groups of the adjacent two rows of the sub-pixel units are connected to the same gate line; and in a column direction, the compensation driving circuits corresponding to the first compensation light emitting groups in odd rows and the compensation driving circuits corresponding to the first compensation light emitting groups in even rows are respectively connected to two different data lines.

For example, in the display panel provided by an embodiment of the present disclosure, the light emitting circuits comprise light emitting elements and switching circuits, and the light emitting elements are connected to the compensation driving circuits through the switching circuits respectively.

At least one embodiment of the present disclosure further provides a display device, which comprises the display panel provided by any one of the embodiments of the present disclosure.

For example, the display device provided by an embodiment of the present disclosure further includes a gate drive circuit, and the gate drive circuit is configured to output gate scanning signals which enable at least every two rows of the sub-pixel units of the display panel to be turned on simultaneously.

For example, the display device provided by an embodiment of the present disclosure further includes a gate drive circuit, and the gate drive circuit is configured to output gate scanning signals which enable the display panel to turn on the sub-pixel units row by row.

At least one embodiment of the present disclosure further provides a method of driving the display panel provided by any one of the embodiments of the present disclosure, which includes: dividing one frame of display scanning into N sequentially performed display time periods; and providing light emitting control signals in a time-division manner through N light emitting control lines, in each row of the sub-pixel units, so that the light emitting circuits connected to the N light emitting control lines emit light during different display time periods.

For example, in the method provided by an embodiment of the present disclosure, N=2, and the light emitting circuits in the sub-pixel units in odd columns and the light emitting circuits in the sub-pixel units in even columns emit light during two different display time periods respectively.

For example, the method provided by an embodiment of the present disclosure further includes: providing gate scanning signals which enable the display panel to turn on the sub-pixel units row by row, so that the display panel emits light row by row.

For example, the method provided by an embodiment of the present disclosure further includes: providing gate scanning signals which enable at least every two rows of the sub-pixel units of the display panel to be turned on simultaneously, so that at least every two rows of the display panel emit light simultaneously.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
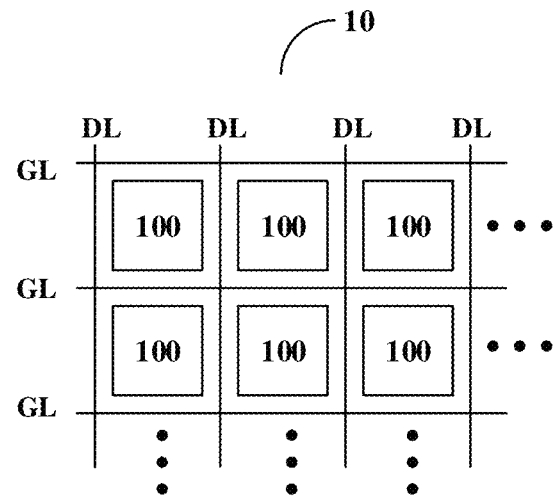
FIG. 1 is a schematic diagram of sub-pixel units arranged in an array in a display panel provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

AMOLED uses thin film transistors (TFTs) to form pixel circuits in order to provide corresponding currents for an OLED device. For example, low temperature polysilicon thin film transistors (LTPS TFTs) or oxide thin film transistors (Oxide TFTs) are mostly adopted. Compared with general amorphous silicon thin film transistors (Amorphous-Si TFTs), LTPS TFT and Oxide TFT have higher mobility and more stable characteristics, and are more applicable to applications in AMOLED display. However, due to the non-uniformity of electrical parameters such as threshold voltage, mobility and so on caused by the limitation of transistor manufacturing process, or since the threshold voltage may drift under long-term pressurization and high temperature, poor display may occurs, for example, mura phenomenon (uneven display brightness) or afterimage phenomenon may occur. For the above problems, it is required to provide compensation driving circuits for each sub-pixel unit to eliminate the non-uniformity of transistors or the drift of threshold voltage of transistors to some extent.

As the user's requirement for the resolution of the display panel is getting higher and higher, the limitation of the display panel manufacturing process has been reached. For example, the highest resolution currently achievable for the display panel using LTPS TFT process is about 600 pixels per inch (PPI), for example, 577 PPI further.

At least one embodiment of the present disclosure provides a display panel. The display panel comprises a plurality of sub-pixel units arranged in an array, a plurality of compensation driving circuits, and a plurality of light emitting control lines. The sub-pixel units each comprise a light emitting circuit, and the array comprises a plurality of rows and a plurality of columns; sub-pixel units in each row are divided into a plurality of compensation light emitting groups, the plurality of compensation light emitting groups comprise a plurality of first compensation light emitting groups, the first compensation light emitting groups each comprise N sub-pixel units that are adjacent, and light emitting circuits of the N sub-pixel units that are adjacent are connected to one same compensation driving circuit for being time-division driven; the light emitting circuits of the N sub-pixel units that are adjacent of each of the first compensation light emitting groups are respectively connected to N light emitting control lines that are different; and N is an integer greater than or equal to 2. At least one embodiment of the present disclosure further provides a display device and a method of driving the display panel corresponding to the display panel described above.

The display panel, the method of driving the display panel and the display device provided by at least one embodiment of the present disclosure can break through the limitation of transistor manufacturing process, so as to obtain a higher resolution.

Hereinafter, the embodiments of the present disclosure and examples thereof are illustrated in detail with reference to the accompanying drawings.

At least one embodiment of the present disclosure provides a display panel 10, as illustrated in FIG. 1. The display panel 10 includes sub-pixel units 100 arranged in an array which includes a plurality of rows and a plurality of columns, and for example, as illustrated in FIG. 1, a plurality of areas arranged in the array are defined by a plurality of gate lines GL and a plurality of data lines DL which are staggered, and a plurality of sub-pixel units 100 are located in the plurality of areas.

For example, the display panel 10 further includes a plurality of compensation driving circuits 200 and a plurality of light emitting control lines EL (which may include, for example, a plurality of first light emitting control lines EL1 and a plurality of second light emitting control lines EL2). The sub-pixel units 100 each include a light emitting circuit 110, sub-pixel units 100 in each row are divided into a plurality of compensation light emitting groups, the plurality of compensation light emitting groups include a plurality of first compensation light emitting groups, the first compensation light emitting groups each include N sub-pixel units 100 that are adjacent, and light emitting circuits 110 of the N sub-pixel units 100 that are adjacent are connected to one same compensation driving circuit 200 for being time-division driven. The light emitting circuits 110 of the N sub-pixel units 100 that are adjacent of each of the first compensation light emitting groups are respectively connected to N light emitting control lines EL that are different. N is an integer greater than or equal to 2.

Figure 2:
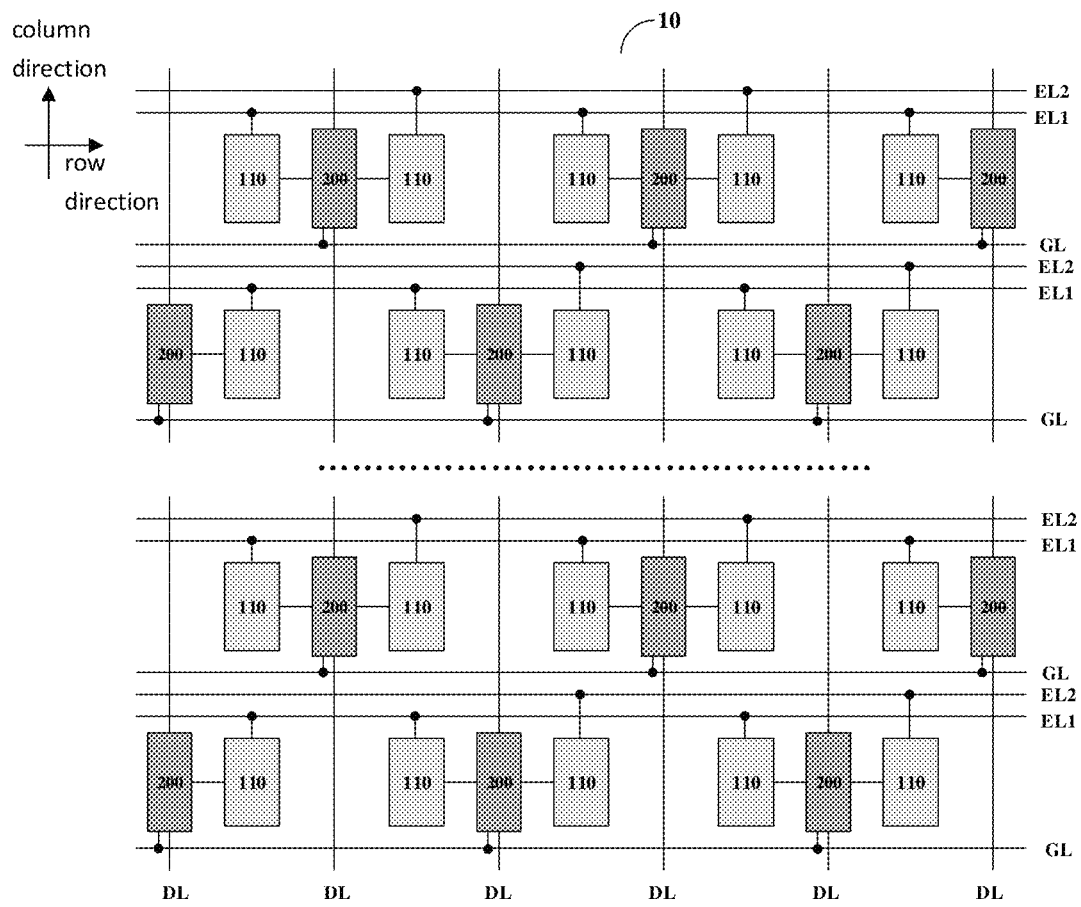
FIG. 2 is a schematic diagram of a first display panel provided by some embodiments of the present disclosure.

For example, in an embodiment, as illustrated in FIG. 2, the first compensation light emitting groups each include two adjacent sub-pixel units 100 (denoted as light emitting circuits 110 in FIG. 2), and the light emitting circuits 110 of the two adjacent sub-pixel units 100 are connected to one same compensation driving circuit 200 for being time-division driven. The light emitting circuits 110 of the two adjacent sub-pixel units 100 of each of the first compensation light emitting groups are respectively connected to two different light emitting control lines EL, for example, connected to a first light emitting control line EL1 and a second light emitting control line EL2, respectively. For example, the first light emitting control line EL1 and the second light emitting control line EL2 are configured to provide light emitting control signals in a time-division manner, so that the two light emitting circuits 110 in each first compensation light emitting group emit light in a time-division manner.

It is needed to be illustrated that in the display panel as illustrated in FIG. 2, only five columns of the sub-pixel units 100 (light emitting circuits 110) are schematically illustrated, and the embodiments of the present disclosure do not limit the number of rows and columns of the sub-pixel units 100 in the display panel.

Figure 3:
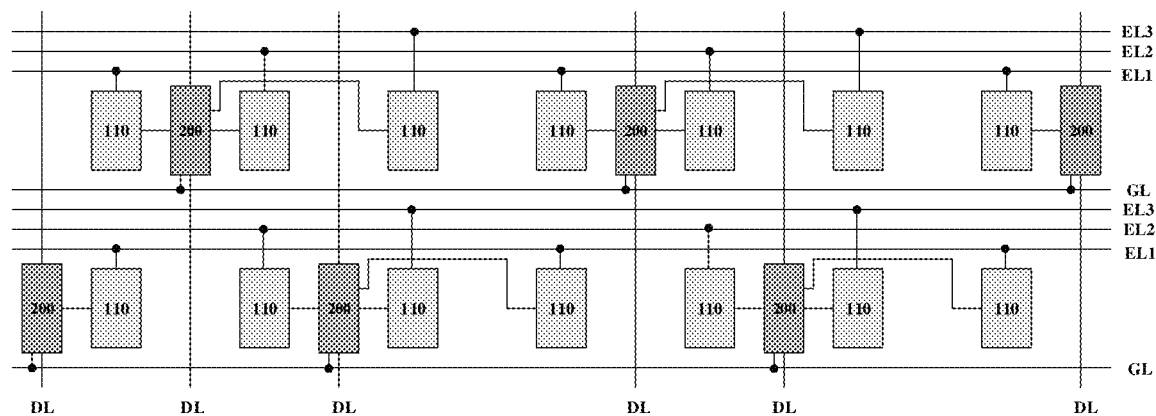
FIG. 3 is a schematic diagram of a second display panel provided by some embodiments of the present disclosure.

For example, in another example, as illustrated in FIG. 3 (only two rows of the sub-pixel units 100 are schematically illustrated in the figure), the first compensation light emitting groups each include three adjacent sub-pixel units 100 (denoted as light emitting circuits 110 in FIG. 3), and light emitting circuits 110 of the three adjacent sub-pixel units 100 are connected to one same compensation driving circuit 200 for being time-division driven. The light emitting circuits 110 of the three adjacent sub-pixel units 100 of each of the first compensation light emitting groups are respectively connected to three different light emitting control lines EL, for example, connected to the first light emitting control line EL1, the second light emitting control line EL2, and a third light emitting control line EL3, respectively.

It is needed to be illustrated that FIGS. 2 and 3 only schematically illustrate examples of N=2 and N=3, but the embodiments of the present disclosure do not limit a value of N, as long as N is an integer greater than or equal to 2.

In the display panel provided by the embodiments of the present disclosure, by setting the first compensation light emitting groups, the light emitting circuits of the N sub-pixel units that are adjacent in the first compensation light emitting groups may share the same compensation driving circuit for being time-division driven, thereby more number of sub-pixel units can be set corresponding to each compensation driving circuit, in the case where the number of the compensation driving circuits set in the display panel is unchanged, so that the resolution of the display panel may be improved.

It is needed to be illustrated that in the embodiments as illustrated in FIGS. 2 and 3, a plurality of first compensation light emitting groups are set in each row, and the embodiments of the present disclosure include but are not limited thereto, and for example, the first compensation light emitting groups may be set, as illustrated in the embodiments of the present disclosure, only in a partial area of the display panel, so that the resolution of the partial area may be improved merely.

For example, the display panel 10 provided by the embodiments of the present disclosure further includes a plurality of gate lines GL and a plurality of data lines DL. Each row of the sub-pixel units 100 correspond to N light emitting control lines EL, and control terminals of the light emitting circuits 110 of N sub-pixel units 100 in each of the first compensation light emitting groups in a same row are respectively connected to the N light emitting control lines EL correspondingly. Each of the compensation driving circuits 200 is connected to one of the gate lines GL and one of the data lines DL, respectively, and for example, the gate lines GL provide gate scanning signals for the compensation driving circuits 200, the data lines DL provide data signals for the compensation driving circuits 200, and the data signals are used to control the light emitting circuits 110 to perform corresponding gray-scale display.

Figure 4:
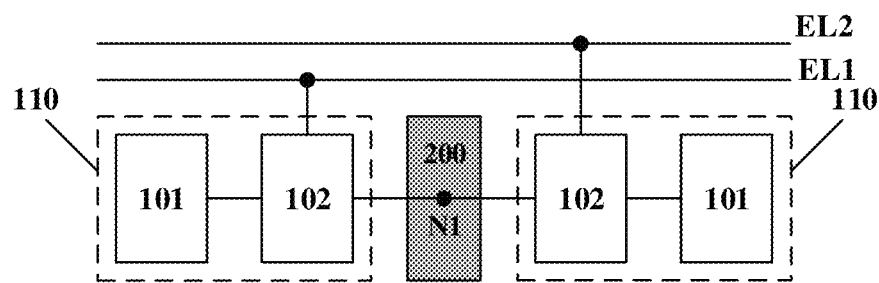
FIG. 4 is a schematic diagram of first compensation light emitting groups in a display panel provided by some embodiments of the present disclosure.

In the embodiments of the present disclosure, as illustrated in FIG. 4, the light emitting circuits 110 may include light emitting elements 101 and switching circuits 102, and the light emitting elements 101 are connected to the compensation driving circuit 200 through the switching circuits 102. Corresponding to the case where the first compensation light emitting groups each, as illustrated in FIG. 2, include two light emitting circuits 110, control terminals of the two switching circuits 102 in the first compensation light emitting group in FIG. 4 are respectively connected to two light emitting control lines EL1 and EL2 correspondingly, that is, the control terminals of the light emitting circuits 110 can be implemented as the control terminals of the switching circuits 102.

Figure 5:
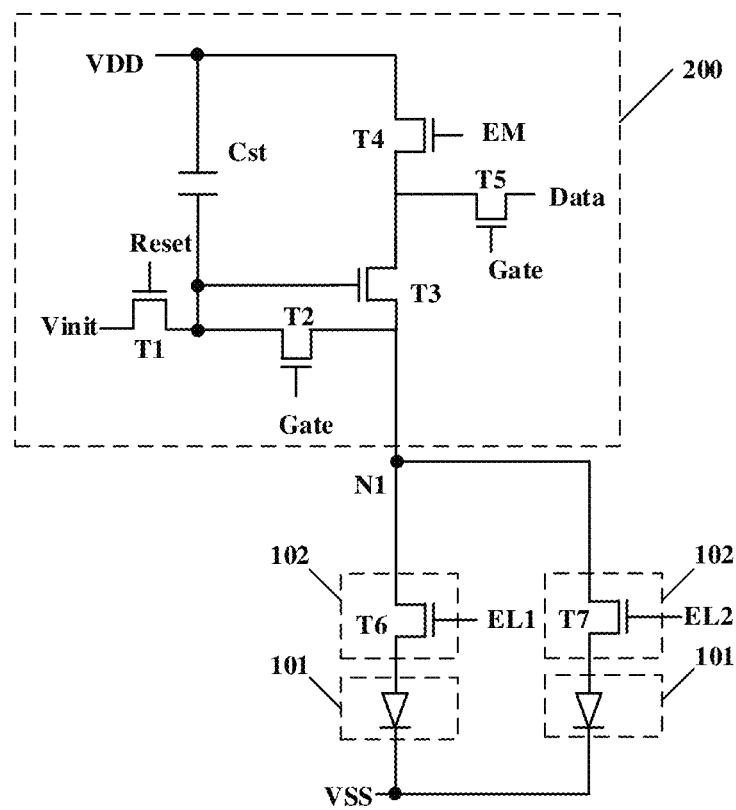
FIG. 5 is a circuit diagram of an implementation example of the first compensation light emitting groups illustrated in FIG. 4.

For the first compensation light emitting groups and the compensation driving circuit 200 connected thereto as illustrated in FIG. 4, in an example, the first compensation light emitting groups and the compensation driving circuit 200 can be implemented as a circuit structure as illustrated in FIG. 5. As illustrated in FIG. 5, the compensation driving circuit 200 can be implemented as a circuit structure of 5T1C (5 transistors and 1 storage capacitor), and a connection relationship is illustrated in FIG. 5. The detailed illustration can be referred to conventional designs and is not repeated here. It is needed to be illustrated that in addition to the compensation driving circuit 200 as illustrated in FIG. 5, the display panel provided by the embodiments of the present disclosure may further adopt other forms of compensation driving circuits, for example, adopt different connection modes, different types of transistors, etc., as long as the function of driving the light emitting circuits 110 in a compensation manner can be realized, and it is not limited in the embodiments of the present disclosure.

For example, the two switching circuits 102 in FIG. 4 may be implemented as transistors T6 and T7 in FIG. 5, respectively. The compensation driving circuit 200 can drive the two light emitting elements 101 electrically connected thereto in a time-division manner. For example, during a display time period, the transistor T6 is turned on and the transistor T7 is turned off, and the compensation driving circuit 200 can drive the light emitting element 101 electrically connected to the transistor T6 in a compensation manner, so that the light emitting element 101 emits light. For another example, during another display time period, the transistor T7 is turned on and the transistor T6 is turned off, and the compensation driving circuit 200 can drive the light emitting element 101 connected to the transistor T7 in a compensation manner, so that the light emitting element 101 emits light.

For example, a control terminal of the switching circuit 102 on left side in FIG. 5 (i.e., a control terminal of the light emitting circuit 110 on the left side) may be implemented as a gate electrode of the transistor T6, and the gate electrode of the transistor T6 is connected to the first light emitting control line ELL so that the switching circuit 102 may be turned on or turned off under control of a light emitting control signal provided by the first light emitting control line EL1. Similarly, a control terminal of the switching circuit 102 on right side in FIG. 5 (i.e., a control terminal of the light emitting circuit 110 on the right side) can be implemented as a gate electrode of the transistor T7, and the gate electrode of the transistor T7 is connected to the second light emitting control line EL2, so that the switching circuit 102 can be turned on or turned off under control of a light emitting control signal provided by the second light emitting control line EL2.

For example, as illustrated in FIG. 5, the light emitting elements 101 may adopt OLEDs, and the OLEDs may be of various types (bottom emission, top emission, etc.), and may emit red light, green light, blue light, etc. as required. The embodiments of the present disclosure include, but are not limited thereto.

For example, in the display panel 10 as illustrated in FIG. 2, two of the light emitting control lines EL are set for each row of the sub-pixel units 100, respectively, which are a first light emitting control line EL1 and a second light emitting control line EL2. In the first compensation light emitting groups of each row of the sub-pixel units 100, control terminals of the light emitting circuits 110 in the sub-pixel units 100 in odd columns are connected to the first light emitting control line EL1, and control terminals of the light emitting circuits 110 in the sub-pixel units 100 in even columns are connected to the second light emitting control line EL2.

For example, when the display panel 10 as illustrated in FIG. 2 is driven in a time-division manner, the first light emitting control line EL1 provides an effective light emitting control signal during a display time period, so that the light emitting circuits 110 in the sub-pixel units 100 in odd columns emit light; and the second light emitting control line EL2 provides an effective light emitting control signal during another display time period, so that the light emitting circuits 110 in the sub-pixel units 100 in even columns emit light, that is, the odd columns and the even columns of the sub-pixel units 100 emit light during two display time periods in a time-division manner, respectively.

In the display panel 10 provided by the embodiments of the present disclosure, for a same row of sub-pixel units 100, the compensation light emitting groups may further include at least one second compensation light emitting group, the second compensation light emitting group each includes one of the sub-pixel units 100, and the light emitting circuit 110 of the one of the sub-pixel units 100 is connected to one of the compensation driving circuits 200. The compensation driving circuits 200 which are corresponding to the first compensation light emitting groups in different rows corresponding to each other in a column direction are connected to one same data line DL. The compensation driving circuits 200 which are corresponding to the second compensation light emitting groups in different rows corresponding to each other in the column direction are connected to another one same data line DL, and the another one same data line DL is different from the one same data line DL connected to the compensation driving circuits 200 corresponding to the first compensation light emitting groups described above.

For example, in the display panel 10 as illustrated in FIG. 2, for a same row of sub-pixel units 100, the compensation light emitting groups may further include at least one second compensation light emitting group. In the column direction, the compensation driving circuits 200 corresponding to the first compensation light emitting groups in different rows corresponding to each other are connected to one same data line DL. For example, referring to FIG. 2, in the column direction, the first compensation light emitting groups in odd rows correspond to each other, and the first compensation light emitting groups in even rows correspond to each other. Similarly, in the column direction, the compensation driving circuits 200 corresponding to the second compensation light emitting groups in different rows corresponding to each other are connected to one same data line DL, and this data line DL is different from the data line DL connected to the compensation driving circuits 200 corresponding to the first compensation light emitting groups described above. For example, in the column direction, the second compensation light emitting groups in odd rows correspond to each other, and the second compensation light emitting groups in even rows correspond to each other.

It is needed to be illustrated that in the embodiments of the present disclosure, corresponding to each other in the column direction means that the first compensation light emitting groups or the second compensation light emitting groups are set correspondingly in an extension direction of the column direction, and may be aligned with each other, or may not be aligned with each other completely, and the embodiments of the present disclosure do not limit this. In addition, it is needed to be illustrated that in the display panel provided by the embodiments of the present disclosure, the sub-pixel units arranged in an array are aligned in a row direction or in a column direction; in a same row, centers of the sub-pixel units are located along a same straight line, and in a same column, centers of the sub-pixel units are located along a same straight line as well, thus a regular matrix is formed, and the embodiments of the present disclosure include but are not limited thereto; for example, the sub-pixel units may not be completely aligned in the row direction or the column direction; and for example, adjacent rows in the array offset from each other by a portion of a width of a sub-pixel unit in the row direction, or adjacent columns offset from each other by a portion of a height of a sub-pixel unit in the column direction, such as half the width or height of the sub-pixel unit. For example, the row direction and the column direction are not limited to the directions as illustrated in FIG. 2, and the row direction and the column direction can also be interchanged, which can be determined according to actual requirements.

Figure 6A:
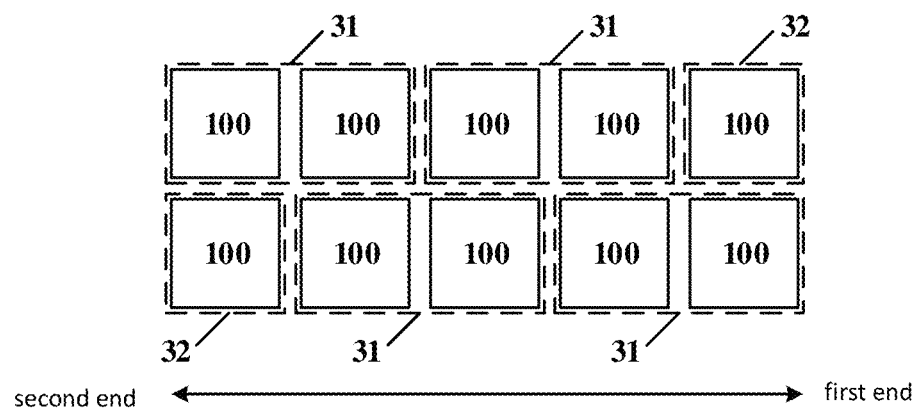
FIG. 6A is a first schematic diagram of a positional relationship between first compensation light emitting groups and second compensation light emitting groups.

A positional relationship between the first compensation light emitting groups and the second compensation light emitting groups in the display panel 10 as illustrated in FIG. 2 can be referred to FIG. 6A (only 5 columns and 2 rows of the sub-pixel units 100 are schematically illustrated in the figure). As illustrated in FIG. 6A, for example, in odd rows of the sub-pixel units 100, the second compensation light emitting group 32 is at a first end in the row direction, and in even rows of the sub-pixel units 100, the second compensation light emitting group 32 is at a second end in the row direction, and the first end and the second end are opposite to each other. In each row of the sub-pixel units 100, a plurality of first compensation light emitting groups 31 are further included.

Figure 6B:
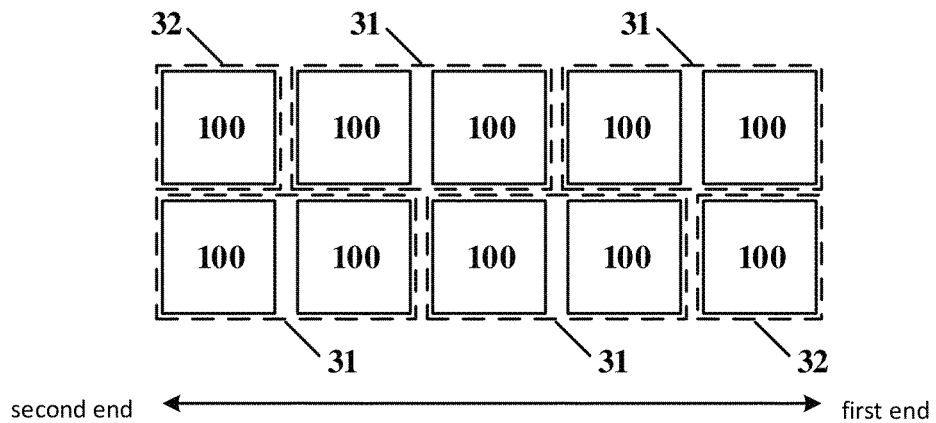
FIG. 6B is a second schematic diagram of a positional relationship between first compensation light emitting groups and second compensation light emitting groups.
Figure 6C:
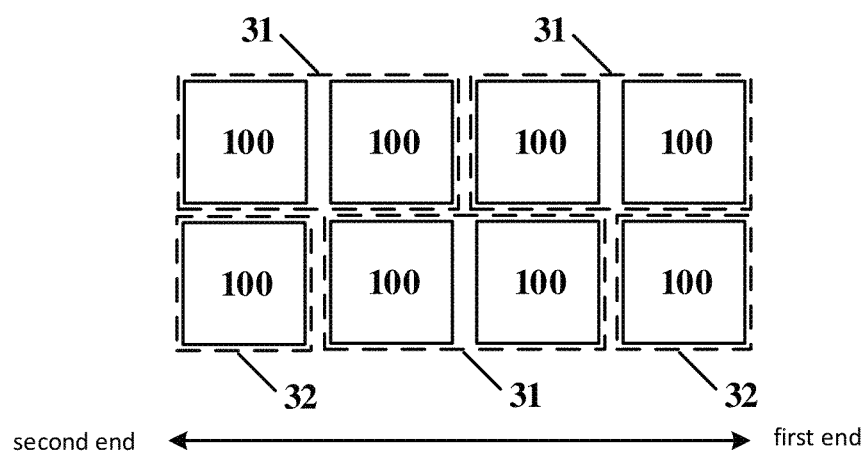
FIG. 6C is a third schematic diagram of a positional relationship between first compensation light emitting groups and second compensation light emitting groups.

With regard to the positional relationship between the first compensation light emitting groups 31 and the second compensation light emitting groups 32, the embodiments of the present disclosure include, but are not limited to the example as illustrated in FIG. 6A. For example, in an example as illustrated in FIG. 6B, in odd rows of the sub-pixel units 100, the second compensation light emitting group 32 is at the second end in the row direction, while in even rows of the sub-pixel units 100, the second compensation light emitting group 32 is at the first end in the row direction. For another example, in an example as illustrated in FIG. 6C, in a case where the number of columns of the sub-pixel units 100 included in the display panel 10 is even number (FIG. 6C illustrates 4 columns as an example), in odd rows of the sub-pixel units 100, only the first compensation light emitting groups 31 may be set without setting the second compensation light emitting groups 32, while in even rows of the sub-pixel units 100, one second compensation light emitting group 32 may be set at the first end and the second end in the row direction, respectively.

For example, in the display panel 10 as illustrated in FIG. 2, each row of the sub-pixel units 100 are correspondingly provided with one of the gate lines GL, and the compensation driving circuits 200 connected to the compensation light emitting groups of a same row of the sub-pixel units are connected to the one of gate lines GL corresponding to the row.

In the display panel 10 provided by the embodiments of the present disclosure, each row of the sub-pixel units 100 are correspondingly provided with one of the gate lines GL, which can enable the display panel 10 to implement scanning row by row, and also to implement scanning simultaneously by multiple rows, for example, scanning simultaneously every two rows.

For example, in the display panel 10 as illustrated in FIG. 2, the gate lines GL corresponding to the (2m−1)th row and the (2m)th row of the sub-pixel units 100 are configured to receive identical gate scanning signals, and m is an integer greater than or equal to 1. For example, the gate lines GL corresponding to a $1^{st}$ row and a $2^{nd}$ row of the sub-pixel units 100 are configured to receive identical gate scanning signals, so that the $1^{st}$ row and the $2^{nd}$ row of the sub-pixel units 100 are scanned simultaneously. Similarly, the gate lines GL corresponding to a $3^{rd}$ row and a $4^{th}$ row, a $5^{th}$ row and a $6^{th}$ row, etc., that is, the gate lines GL corresponding to every two rows of the sub-pixel units 100 are configured to receive identical gate scanning signals.

In the display panel provided by the embodiments of the present disclosure, for example, the display of an entire picture is completed within one frame of display scanning; and when odd columns and even columns of the sub-pixel units are time-divisionally driven to display, the odd columns or the even columns of the sub-pixel units has half a frame of time for being driven in a compensation manner and displaying. Based on the foregoing case, every two rows of the sub-pixel units are set to be scanned simultaneously; and compared with the case of scanning row by row, the odd columns or the even columns of the sub-pixel units can complete the compensation drive and display of a frame of the picture within a frame of time (that is, the odd columns or the even columns of the sub-pixel units has half a frame of time for being driven in a compensation manner and displaying; and since every two rows of the sub-pixel units are set to be scanned simultaneously, the display panel provided by the embodiments of the present disclosure takes the same time as that of a normal display panel to complete one frame of display and scanning, compared with the case of scanning row by row in the normal display panel), thereby the resolution of the display panel can be improved without losing display effects.

The working process of the display panel 10 as illustrated in FIG. 2 is described below with reference to FIGS. 7A, 7B, 8A and 8B. It is needed to be illustrated that in FIGS. 7A, 7B, 8A and 8B, for convenience of description, four rows and five columns of sub-pixel units 100 are taken as an example for illustrating.

Figure 7A:
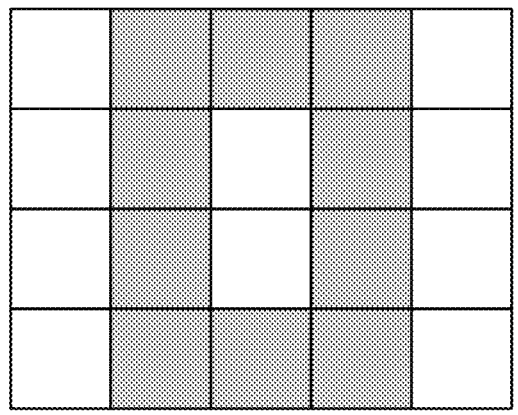
FIG. 7A is a first schematic diagram in which odd columns and even columns of sub-pixel units display in a time-division manner.
Figure 7B:
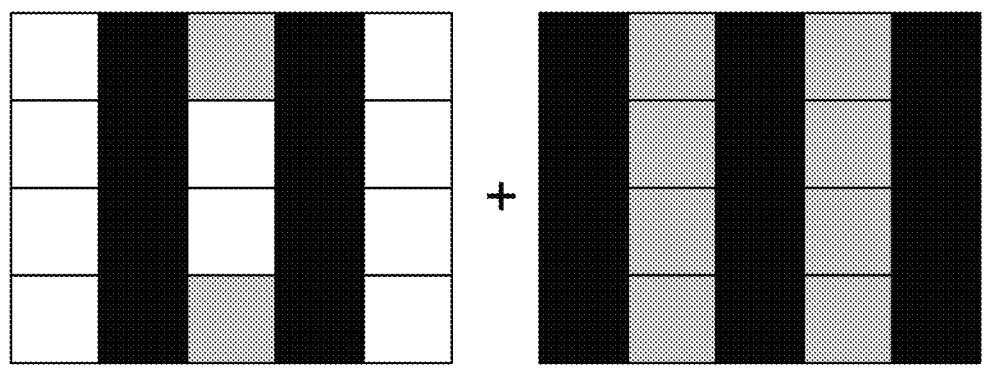
FIG. 7B is a second schematic diagram in which odd columns and even columns of sub-pixel units display in a time-division manner.

For example, for the picture with a number "0" as illustrated in FIG. 7A, it may be formed by superimposing two pictures in FIG. 7B. It is needed to be illustrated that in FIG. 7B, black color indicates that the sub-pixel units 100 do not emit light. For example, in order to display the picture as illustrated in FIG. 7A within a frame of display scanning, the display panel 10 may enable odd columns of the sub-pixel units 100 to emit light in a first half frame of display scanning and enable even columns of the sub-pixel units 100 to emit light in a last half frame of display scanning. Of course, the display panel 10 may also enable even columns of the sub-pixel units 100 to emit light in a first half frame of display scanning and enable odd columns of the sub-pixel units 100 to emit light in a last half frame of display scanning. The embodiments of the present disclosure are not limited to this.

Figure 8A:
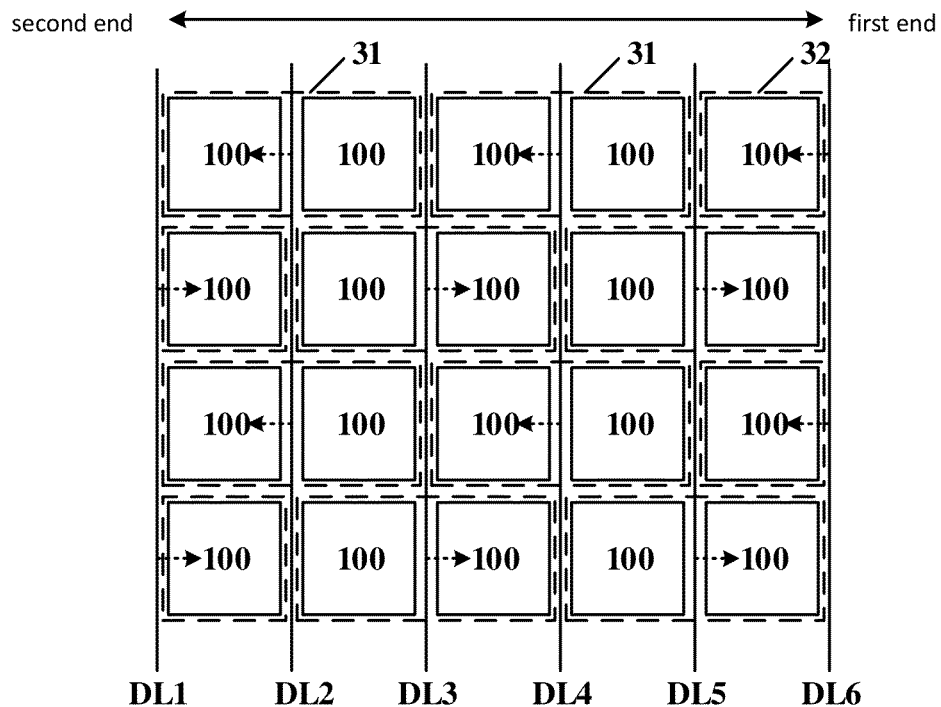
FIG. 8A is a schematic diagram in which data signals are applied when odd columns of sub-pixel units display.

For example, in an example, the picture on left side in FIG. 7B is displayed in the first half of frame display scanning, that is, odd columns of the sub-pixel units 100 emit light. For example, as illustrated in FIG. 8A, firstly the gate lines GL corresponding to the $1^{st}$ row and the $2^{nd}$ row of the sub-pixel units 100 (referring to FIG. 2) receive identical gate scanning signals, so that the compensation driving circuits 200 corresponding to the $1^{st}$ row and the $2^{nd}$ row of the sub-pixel units 100 are turned on; the first light emitting control lines EL1 corresponding to the $1^{st}$ row and the $2^{nd}$ row (referring to FIG. 2) receive effective light emitting control signals, so that the light emitting circuits 110 in a $1^{st}$ column, a $3^{rd}$ column and a $5^{th}$ column of the sub-pixel units 100 are turned on; meanwhile, data signals of the $1^{st}$ column, the $3^{rd}$ column and the $5^{th}$ column of the sub-pixel units 100 in the $1^{st}$ row are provided by data lines DL2, DL4 and DL6 through the compensation driving circuits 200, respectively; and data signals of the $1^{st}$ column, the $3^{rd}$ column and the $5^{th}$ column of the sub-pixel units 100 in the $2^{nd}$ row are provided by data lines DL1, DL3 and DL5 through the compensation driving circuits 200, respectively. After odd columns of the sub-pixel units 100 in the $1^{st}$ row and the $2^{nd}$ row complete display, odd columns of the sub-pixel units 100 in the $3^{rd}$ row and the $4^{th}$ row perform display. The working process is similar to that of the $1^{st}$ row and the $2^{nd}$ row, and is not repeated.

Figure 8B:
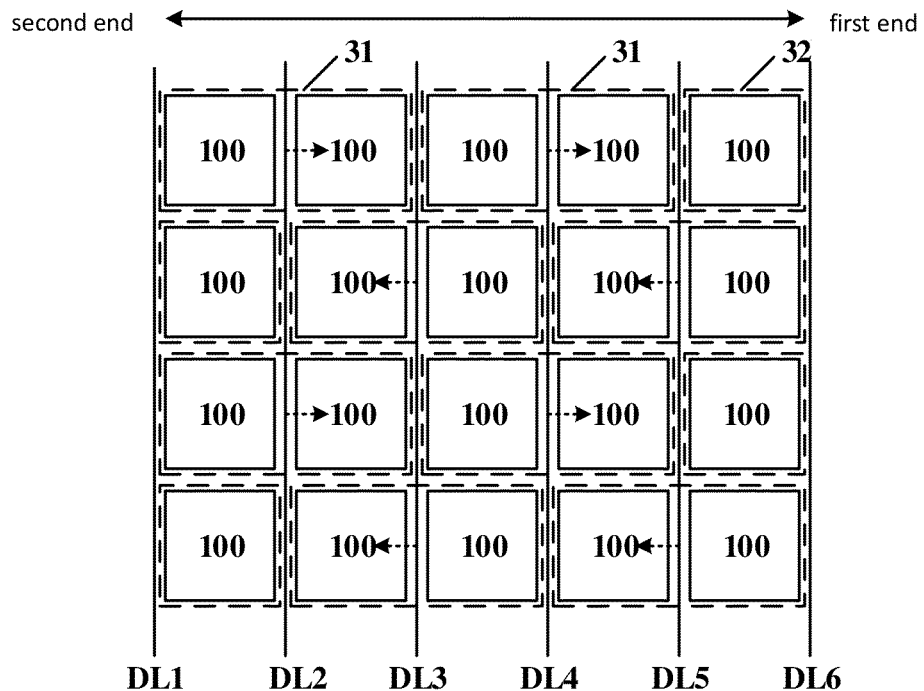
FIG. 8B is a schematic diagram in which data signals are applied when even columns of sub-pixel units display.

The picture on right side in FIG. 7B is displayed in a last half frame of display scanning, that is, even columns of the sub-pixel units 100 emit light. For example, as illustrated in FIG. 8B, firstly the gate lines GL corresponding to the $1^{st}$ row and the $2^{nd}$ row of the sub-pixel units 100 (referring to FIG. 2) receive identical gate scanning signals, so that the compensation driving circuits 200 corresponding to the $1^{st}$ row and the $2^{nd}$ row of the sub-pixel units 100 are turned on; the second light emitting control lines EL2 corresponding to the $1^{st}$ row and the $2^{nd}$ row (referring to FIG. 2) receive effective light emitting control signals, so that the light emitting circuits 110 in a $2^{nd}$ column and a $4^{th}$ column of the sub-pixel units 100 are turned on; meanwhile, data signals of the $2^{nd}$ column and the $4^{th}$ column of the sub-pixel units 100 in the $1^{st}$ row are provided by data lines DL2 and DL4 through the compensation driving circuits 200, respectively; and data signals of the $2^{nd}$ column and the $4^{th}$ column of the sub-pixel units 100 in the $2^{nd}$ row are provided by data lines DL3 and DL5 through the compensation driving circuits 200, respectively. After even columns of the sub-pixel units 100 in the $1^{st}$ row and the $2^{nd}$ row complete display, even columns of the sub-pixel units 100 in the $3^{rd}$ row and the $4^{th}$ row perform display. The working process is similar to that of the $1^{st}$ row and the $2^{nd}$ row, and is not repeated.

Figure 9:
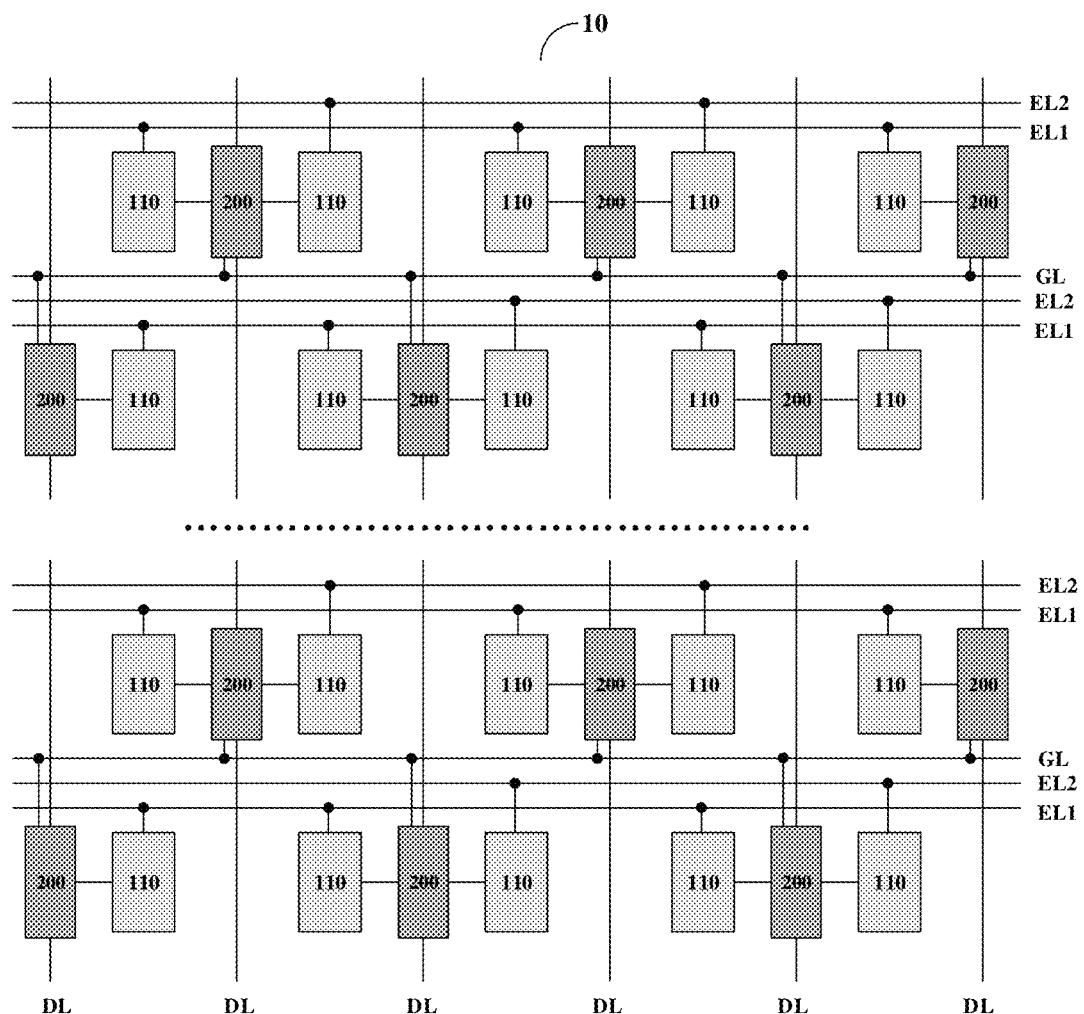
FIG. 9 is a schematic diagram of a third display panel provided by some embodiments of the present disclosure.

In the display panel 10 provided by an embodiment of the present disclosure, as illustrated in FIG. 9, every adjacent two rows of the sub-pixel units 100 are correspondingly provided with a same one of the gate lines GL, so that the compensation driving circuits 200 connected to the compensation light emitting groups of every adjacent two rows of the sub-pixel units are connected to the same one of the gate lines GL.

In the embodiment as illustrated in FIG. 9, since every adjacent two rows of the sub-pixel units 100 are correspondingly provided with a same one of the gate lines GL, one gate line GL can be omitted for every two rows of the sub-pixel units 100, compared with the embodiment as illustrated in FIG. 2. In the case as illustrated in FIG. 9, only scanning simultaneously every adjacent two rows can be implemented, but scanning row by row cannot be implemented.

Figure 10:
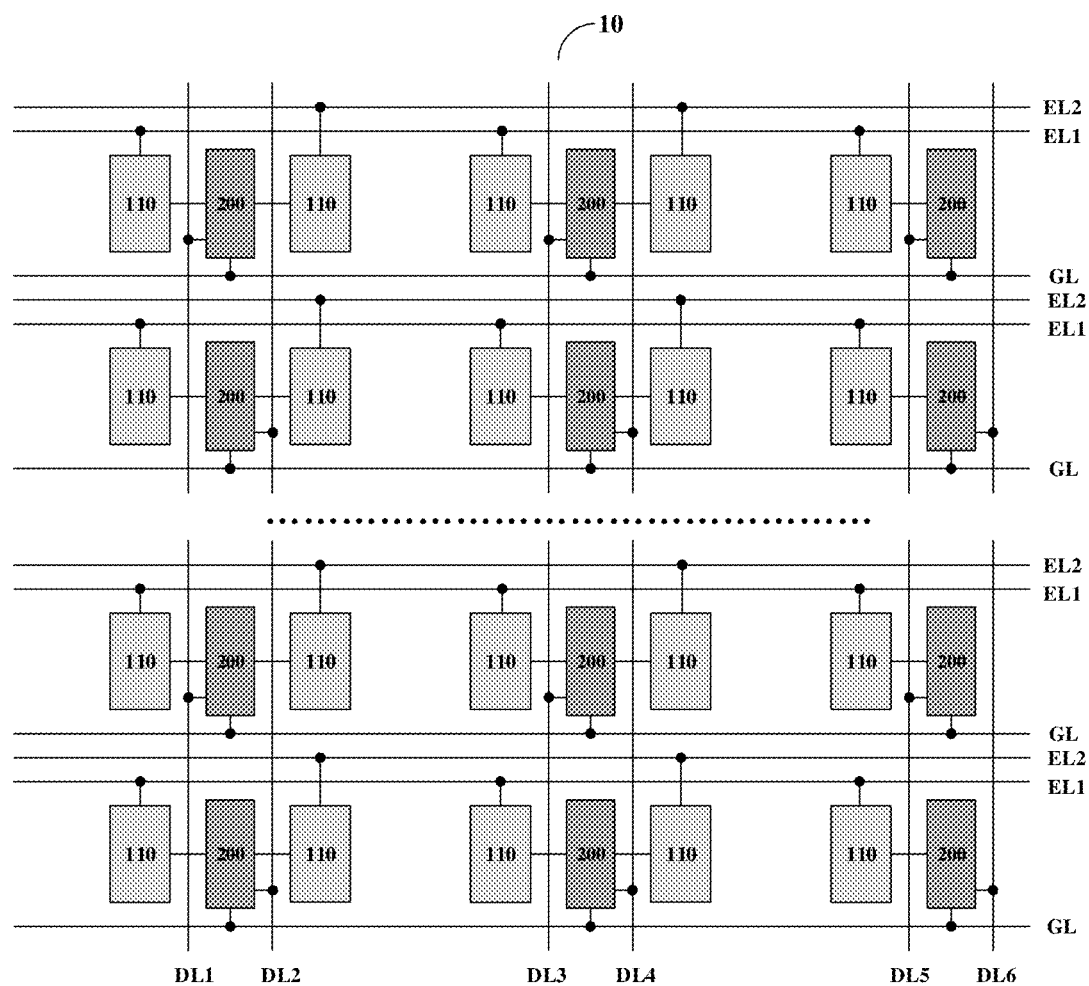
FIG. 10 is a schematic diagram of a fourth display panel provided by some embodiments of the present disclosure.
Figure 11:
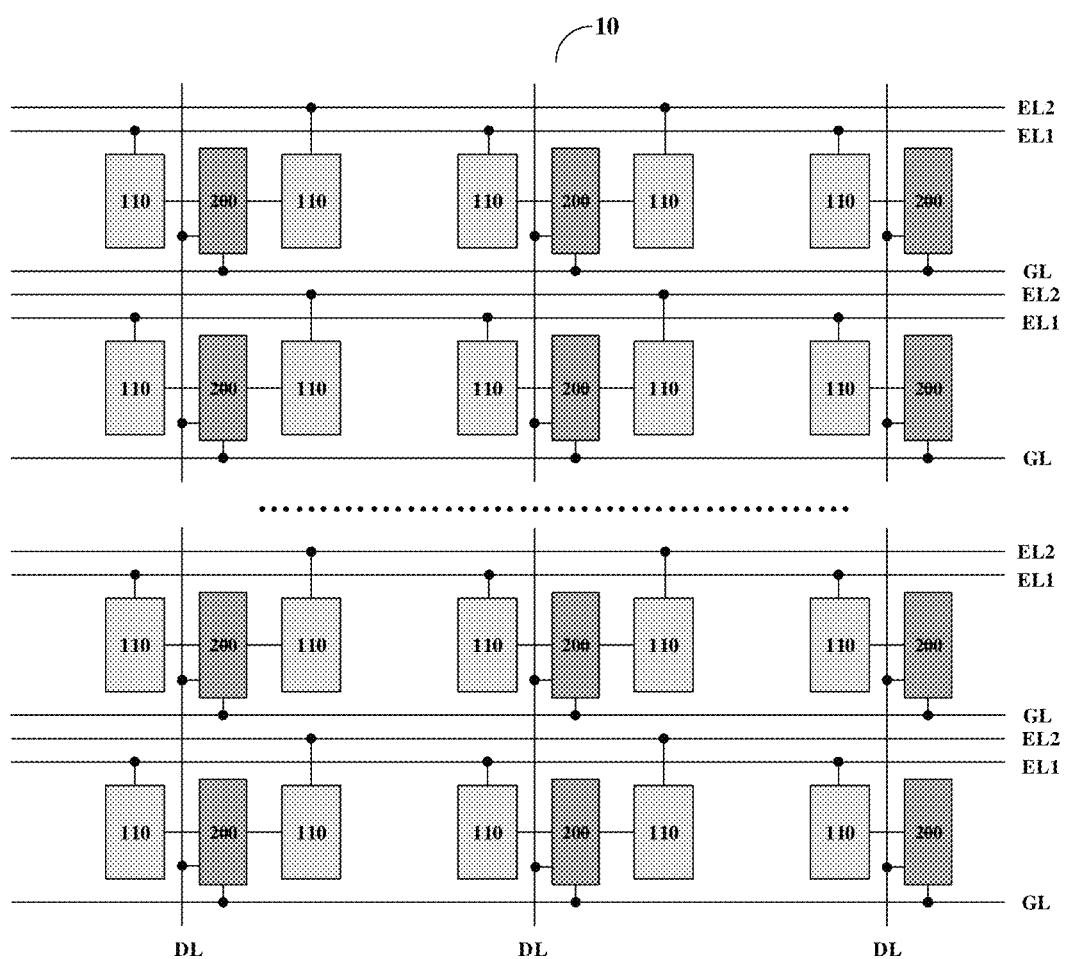
FIG. 11 is a schematic diagram of a fifth display panel provided by some embodiments of the present disclosure.
Figure 12:
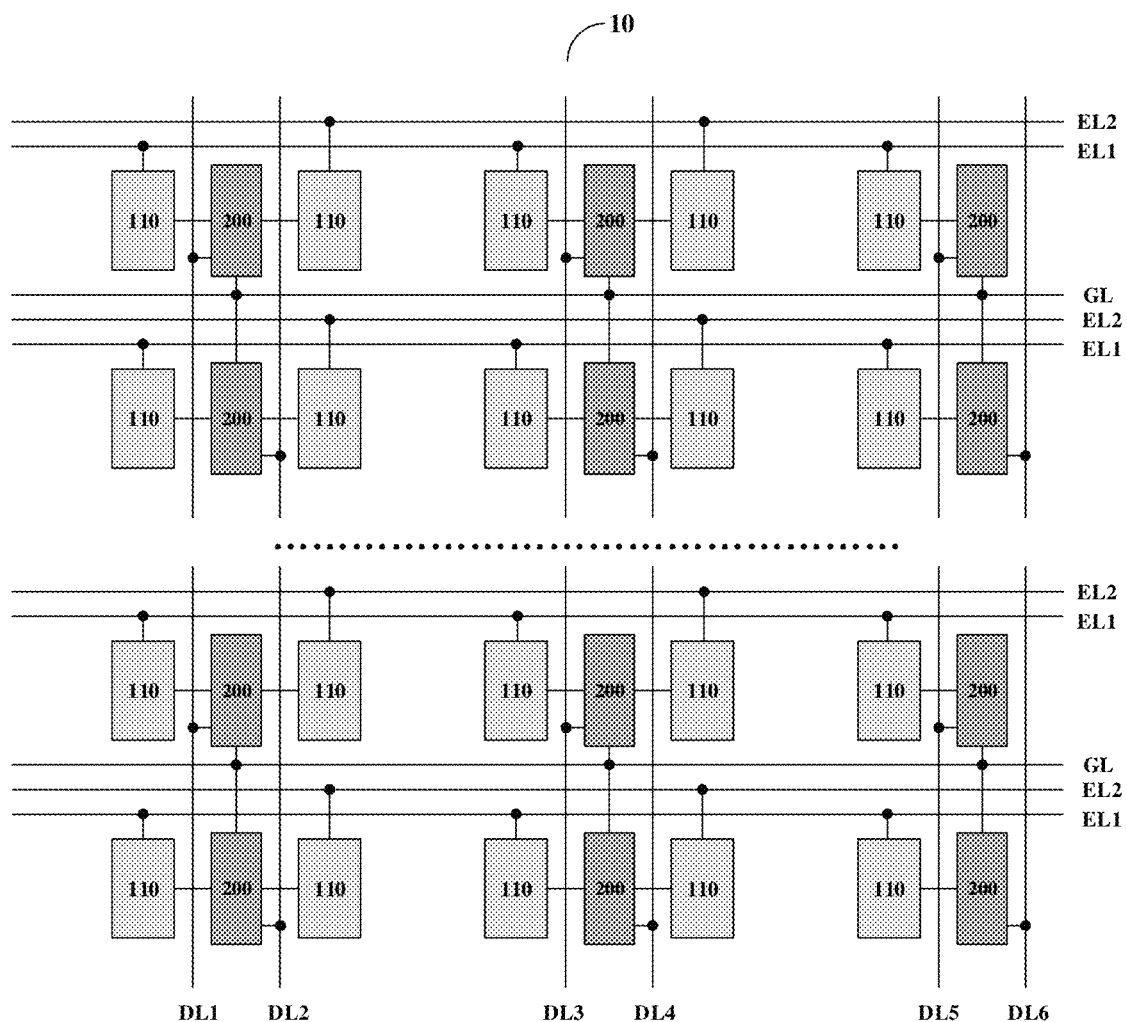
FIG. 12 is a schematic diagram of a sixth display panel provided by some embodiments of the present disclosure.

For example, in some embodiments, as illustrated in FIGS. 10, 11, and 12, the first compensation light emitting groups in different rows are correspondingly set (e.g., aligned) in the column direction.

For example, same as the embodiment as illustrated in FIG. 2, in the embodiments as illustrated in FIGS. 10, 11, and 12, two light emitting control lines EL are provided correspondingly for each row of the sub-pixel units 100, which are, respectively, a first light emitting control line EL1 and a second light emitting control line EL2. In the first compensation light emitting groups of each row of the sub-pixel units 100, control terminals of the light emitting circuits 110 in the sub-pixel units 100 in odd columns are connected to the first light emitting control line EL1, and control terminals of the light emitting circuits 110 in the sub-pixel units 100 in even columns are connected to the second light emitting control line EL2.

For example, in the embodiments as illustrated in FIGS. 10, 11 and 12, in a case where the number of columns of the sub-pixel units 100 in the display panel 10 is odd number, the display panel 10 may further includes a second compensation light emitting group in each row of the sub-pixel units 100, for example, the second compensation light emitting group in each row is at a same end in the row direction.

For example, in the display panel 10 as illustrated in FIG. 10, each row of the sub-pixel units 100 are provided correspondingly with one of the gate lines GL, and the compensation driving circuits 200 connected to the compensation light emitting groups of a same row of the sub-pixel units 100 are connected to the one of the gate lines GL corresponding to the row. In the column direction, the compensation driving circuits 200 corresponding to the first compensation light emitting groups in odd rows and the compensation driving circuits 200 corresponding to the first compensation light emitting groups in even rows are respectively connected to two different data lines DL. For example, for the first compensation light emitting groups of a 1$^{st}$ column, the compensation driving circuits 200 corresponding to the first compensation light emitting groups in odd rows are connected to a data line DL1, while the compensation driving circuits 200 corresponding to the first compensation light emitting groups in even rows are connected to a data line DL2. Similarly, for the first compensation light emitting groups of a 2$^{nd}$ column, the compensation driving circuits 200 corresponding to the first compensation light emitting groups in odd rows are connected to a data line DL3, while the compensation driving circuits 200 corresponding to the first compensation light emitting groups in even rows are connected to a data line DL4.

In the display panel 10 as illustrated in FIG. 10, each row of the sub-pixel units 100 include one second compensation light emitting group. For this column of second compensation light emitting groups, the compensation driving circuits 200 corresponding to the second compensation light emitting groups in odd rows are connected to a data line DL5, while the compensation driving circuits 200 corresponding to the second compensation light emitting groups in even rows are connected to a data line DL6.

In the display panel 10 as illustrated in FIG. 10, since each row of the sub-pixel units 100 are provided with one of the gate lines GL, and in the column direction, the compensation driving circuits 200 corresponding to the first compensation light emitting groups in odd rows and the compensation driving circuits 200 corresponding to the first compensation light emitting groups in even rows are respectively connected to two different data lines, and the compensation driving circuits 200 corresponding to the second compensation light emitting groups in odd rows and the compensation driving circuits 200 corresponding to the second compensation light emitting groups in even rows are respectively connected to two different data lines, the display panel 10 can implement scanning simultaneously every adjacent two rows as well as scanning row by row.

For example, in the display panel 10 as illustrated in FIG. 11, each row of the sub-pixel units 100 are provided with one of the gate lines GL, and the compensation driving circuits 200 connected to the compensation light emitting groups of a same row of the sub-pixel units 100 are connected to the one of the gate lines GL corresponding to the row. A difference from the display panel 10 as illustrated in FIG. 10 is that: in the column direction, the compensation driving circuits 200 which are corresponding to the first compensation light emitting groups in different rows are connected to one same data line DL, while the compensation driving circuits 200 which are corresponding to the second compensation light emitting groups in different rows are connected to another one same data line DL.

Compared with the display panel 10 as illustrated in FIG. 10, the display panel 10 as illustrated in FIG. 11 has fewer data lines DL, and the display panel 10 as illustrated in FIG. 11 can implement scanning row by row, but cannot implement simultaneous scanning for every adjacent two rows.

For example, in the display panel 10 as illustrated in FIG. 12, every adjacent two rows of the sub-pixel units 100 are provided with one same gate line GL, so that the compensation driving circuits 200 connected to the compensation light emitting groups of the two adjacent rows of the sub-pixel units 100 are connected to the same gate line GL. In the column direction, the compensation driving circuits 200 corresponding to the first compensation light emitting groups in odd rows and the compensation driving circuits 200 corresponding to the first compensation light emitting groups in even rows are respectively connected to two different data lines. A connection mode of the data lines in FIG. 12 is the same as that in FIG. 10, and is not repeated here.

In the display panel 10 as illustrated in FIG. 12, since every adjacent two rows of the sub-pixel units 100 are provided correspondingly with one same gate line GL, one gate line GL can be omitted for every two rows of the sub-pixel units 100, compared with the display panel 10 as illustrated in FIG. 10. In the case as illustrated in FIG. 12, only simultaneous scanning of every two adjacent rows can be implemented, but scanning row by row cannot be implemented.

Figure 13:
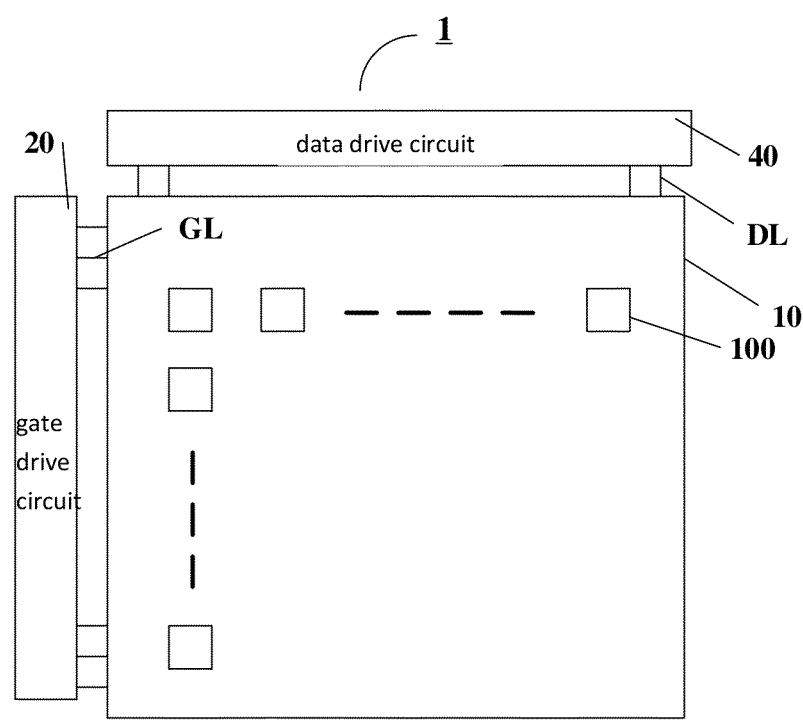
FIG. 13 is a schematic diagram of a display device provided by some embodiments of the present disclosure.

The embodiments of the present disclosure further provide a display device 1, as illustrated in FIG. 13, and the display device 1 includes the display panel 10 provided by the embodiments of the present disclosure. The display panel 10 includes sub-pixel units 100 arranged in an array.

For example, as illustrated in FIG. 13, the display device 1 further includes a gate drive circuit 20 which is electrically connected to the sub-pixel units 100 through gate lines GL for providing gate scanning signals to the sub-pixel array. For example, in an embodiment, the gate drive circuit 20 is configured to output gate scanning signals which enable at least every two rows of the display panel 10 to be turned on simultaneously, so that the display panel 10 can implement simultaneous scanning of every at least two adjacent rows; for example, every adjacent two rows of the display panel 10 can be scanned simultaneously, and for another example, every adjacent three rows of the display panel 10 can be scanned simultaneously. For example, in another embodiment, the gate drive circuit 20 may also be configured to output gate scanning signals which enable the display panel 10 to be turned on row by row, so that the display panel 10 can implement scanning row by row.

For example, as illustrated in FIG. 13, the display device 1 may further include a data drive circuit 40 which is electrically connected to the sub-pixel units 100 through data lines DL for providing data signals to the sub-pixel array.

It is needed to be illustrated that the display device 1 provided by the embodiments of the present disclosure may be any products or components having a display function such as a display, an OLED panel, an OLED television, a mobile phone, a tablet computer, a notebook computer, a digital photo frame, a navigator, etc.

The technical effects of the display device 1 provided by the embodiments of the present disclosure can be referred to the corresponding description of the display panel 10 in the embodiments described above, which is not repeated here.

The embodiments of the present disclosure further provide a method of driving a display panel which can be used for the display panel 10 provided by the embodiments of the present disclosure and the display device 1 including the display panel 10. For example, in an example, the method includes following operations.

Step S100: dividing one frame of display scanning into N sequentially performed display time periods; and Step S200: providing light emitting control signals in a time-division manner through N light emitting control lines, in each row of the sub-pixel units, so that the light emitting circuits connected to the N light emitting control lines emit light during different display time periods.

For example, for the display panel 10 as illustrated in FIG. 2, in the step S100, the one frame of display scanning may be divided into two sequentially performed display time periods, i.e., N=2. In the step S200, the light emitting control signals are provided through two light emitting control lines EL (e.g., a first light emitting control line EL1 and a second light emitting control line EL2) in a time-division manner, so that the light emitting circuits 110 connected to the two light emitting control lines EL emit light during two different display time periods, respectively.

For example, in an example, the light emitting circuits 110 in the sub-pixel units in odd columns and the light emitting circuits 110 in the sub-pixel units in even columns emit light during two different display time periods, respectively. It is needed to be illustrated that the working process that the odd columns and the even columns of the sub-pixel units display in a time-division manner can be referred to the corresponding description in the above-mentioned embodiments about the display panel 10, which is not repeated here.

For example, in an embodiment, the method may further include following operations.

Step S300: providing gate scanning signals which enable the display panel to be turned on row by row, so that the display panel emits light row by row.

For example, a gate drive circuit may be adopted to output the gate scanning signals which enable the display panel to be turned on row by row, so that the display panel emits light row by row.

For example, in another embodiment, the method may further include following operations.

Step S400: providing gate scanning signals which enable at least every two rows of the display panel to be turned on simultaneously, so that the at least every two rows of the display panel emit light simultaneously.

For example, a gate drive circuit may be adopted to output the gate scanning signals which enable at least every two rows of the display panel to be turned on simultaneously, for example, every two rows are turned on simultaneously, and for another example, every three rows are turned on simultaneously, and the embodiments of the present disclosure are not limited thereto.

The technical effects of the method provided by the embodiments of the present disclosure can be referred to the corresponding description of the display panel 10 in the embodiments described above, which is not repeated here.

What are described above is related to the specific embodiments of the present disclosure only and not limitative to the scope of the disclosure; the scopes of the disclosure are defined by the accompanying claims.

What is claimed is:

1. A display panel, comprising a plurality of sub-pixel units arranged in an array, a plurality of compensation driving circuits, and a plurality of light emitting control lines,
   wherein the sub-pixel units each comprise a light emitting circuit, and the array comprises a plurality of rows and a plurality of columns;
   sub-pixel units in each row are divided into a plurality of compensation light emitting groups, the plurality of compensation light emitting groups comprise a plurality of first compensation light emitting groups, the first compensation light emitting groups each comprise N sub-pixel units that are adjacent, and light emitting circuits of the N sub-pixel units that are adjacent are connected to one same compensation driving circuit for being time-division driven;
   light emitting circuits of the N sub-pixel units that are adjacent of each of the first compensation light emitting groups are respectively connected to N light emitting control lines that are different; and
   N is an integer greater than or equal to 2,
   wherein the display panel further comprises a plurality of gate lines and a plurality of data lines,
   wherein each row of the sub-pixel units corresponds to N light emitting control lines, and control terminals of the light emitting circuits of N sub-pixel units in each of the first compensation light emitting groups in a same row are respectively connected to the N light emitting control lines correspondingly; and
   each of the compensation driving circuits is connected to one of the gate lines and one of the data lines, respectively,
   for a same row of the sub-pixel units, the compensation light emitting groups further comprise at least one second compensation light emitting group,
   the at least one second compensation light emitting group each comprises only one sub-pixel unit, and the light emitting circuit of the one sub-pixel unit is connected to one compensation driving circuit;
   the compensation driving circuits which are corresponding to the first compensation light emitting groups in different rows corresponding to each other in a column direction are connected to one same data line; and
   the compensation driving circuits which are corresponding to second compensation light emitting groups in different rows corresponding to each other in the column direction are connected to another one same data line, wherein the one compensation driving circuit connected to the one sub-pixel unit of each of the at least one second compensation light emitting group only is connected to one sub-pixel unit, wherein in odd rows of the sub-pixel units, only two second compensation light emitting groups are disposed in a row direction, each of the two second compensation light emitting groups is one of the at least one second compensation light emitting group, the two second compensation light emitting groups are disposed at a first end and a second end of the row direction, and in even rows of the sub-pixel units, only the first compensation light emitting group is disposed in the row direction;

or, in the even rows of the sub-pixel units, only two second compensation light emitting groups are disposed in a row direction, each of the two second compensation light emitting groups is one of the at least one second compensation light emitting group, the two second compensation light emitting groups are disposed at a first end and a second end of the row direction, and in odd rows of the sub-pixel units, only the first compensation light emitting group is disposed in the row direction, wherein the first end and the second end are opposite to each other.

2. The display panel according to claim 1, wherein N=2, each row of the sub-pixel units correspond to two of the light emitting control lines, which are respectively a first light emitting control line and a second light emitting control line; and in the first compensation light emitting groups of each row of the sub-pixel units, control terminals of light emitting circuits in the sub-pixel units in odd columns are connected to the first light emitting control line, and control terminals of light emitting circuits in the sub-pixel units in even columns are connected to the second light emitting control line.

3. The display panel according to claim 2, wherein the first compensation light emitting groups in different rows are aligned in a column direction.

4. The display panel according to claim 3, wherein each row of the sub-pixel units correspond to one of the gate lines, and the compensation driving circuits connected to the compensation light emitting groups of a same row of the sub-pixel units are connected to the one of the gate lines corresponding to the row; and in the column direction, the compensation driving circuits corresponding to the first compensation light emitting groups in odd rows and the compensation driving circuits corresponding to the first compensation light emitting groups in even rows are respectively connected to two different data lines.

5. The display panel according to claim 3, wherein each row of the sub-pixel units correspond to one of the gate lines, and the compensation driving circuits connected to the compensation light emitting groups of a same row of the sub-pixel units are connected to the one of the gate lines corresponding to the row; and in the column direction, the compensation driving circuits corresponding to the first compensation light emitting groups in different rows are connected to one same data line.

6. The display panel according to claim 3, wherein every adjacent two rows of the sub-pixel units correspond to one same gate line, and the compensation driving circuits connected to the compensation light emitting groups of the adjacent two rows of the sub-pixel units are connected to the same gate line; and in the column direction, the compensation driving circuits corresponding to the first compensation light emitting groups in odd rows and the compensation driving circuits corresponding to the first compensation light emitting groups in even rows are respectively connected to two different data lines.

7. The display panel according to claim 1, wherein, in odd rows of the sub-pixel units, the second compensation light emitting group is at a first end in a row direction, in even rows of the sub-pixel units, the second compensation light emitting group is at a second end in the row direction, and the first end and the second end are opposite to each other.

8. The display panel according to claim 1, wherein each row of the sub-pixel units correspond to one of the gate lines, and the compensation driving circuits connected to the compensation light emitting groups of the same row of the sub-pixel units are connected to a gate line corresponding to the row.

9. The display panel according to claim 8, wherein the gate lines corresponding to a (2m−1)th row and a (2m)th row of the sub-pixel units are configured to receive identical gate scanning signals, and m is an integer greater than or equal to 1.

10. The display panel according to claim 1, wherein every adjacent two rows of the sub-pixel units correspond to one same gate line, and the compensation driving circuits connected to the compensation light emitting groups of the adjacent two rows of the sub-pixel units are connected to the same gate line.

11. The display panel according to claim 1, wherein the light emitting circuits comprise light emitting elements and switching circuits, and the light emitting elements are connected to the compensation driving circuits through the switching circuits respectively.

12. A display device, comprising the display panel according to claim 1.

13. The display device according to claim 12, further comprising a gate drive circuit, wherein the gate drive circuit is configured to output gate scanning signals which enable at least every two rows of the sub-pixel units of the display panel to be turned on simultaneously.

14. The display device according to claim 12, further comprising a gate drive circuit, wherein the gate drive circuit is configured to output gate scanning signals which enable the display panel to turn on the sub-pixel units row by row.

15. A method of driving the display panel according to claim 1, comprising:

dividing one frame of display scanning into N sequentially performed display time periods; and providing light emitting control signals in a time-division manner through the N light emitting control lines, in each row of the sub-pixel units, so that the light emitting circuits connected to the N light emitting control lines emit light during different display time periods.

16. The method according to claim 15, wherein N=2, and the light emitting circuits in the sub-pixel units in odd columns and the light emitting circuits in the sub-pixel units in even columns emit light during two different display time periods respectively.

17. The method according to claim 15, further comprising:
provides gate scanning signals which enable the display panel to turn on the sub-pixel units row by row, so that the display panel emits light row by row.

18. The method according to claim 15, further comprising:
providing gate scanning signals which enable at least every two rows of the sub-pixel units of the display panel to be turned on simultaneously, so that at least every two rows of the display panel emit light simultaneously.

19. A display panel, comprising a plurality of sub-pixel units arranged in an array, a plurality of compensation driving circuits, and a plurality of light emitting control lines,
wherein the sub-pixel units each comprise a light emitting circuit, and the array comprises a plurality of rows and a plurality of columns;
sub-pixel units in each row are divided into a plurality of compensation light emitting groups, the plurality of compensation light emitting groups comprise a plurality of first compensation light emitting groups, the first compensation light emitting groups each comprise N sub-pixel units that are adjacent, and light emitting circuits of the N sub-pixel units that are adjacent are connected to one same compensation driving circuit for being time-division driven;
light emitting circuits of the N sub-pixel units that are adjacent of each of the first compensation light emitting groups are respectively connected to N light emitting control lines that are different; and
N is an integer greater than or equal to 2,
wherein the display panel further comprises a plurality of gate lines and a plurality of data lines,
wherein each row of the sub-pixel units corresponds to N light emitting control lines, and control terminals of the light emitting circuits of N sub-pixel units in each of the first compensation light emitting groups in a same row are respectively connected to the N light emitting control lines correspondingly; and
each of the compensation driving circuits is connected to one of the gate lines and one of the data lines, respectively,
for a same row of the sub-pixel units, the compensation light emitting groups further comprise at least one second compensation light emitting group,
the at least one second compensation light emitting group each comprises only one sub-pixel unit, and the light emitting circuit of the one sub-pixel unit is connected to one compensation driving circuit;
the compensation driving circuits which are corresponding to the first compensation light emitting groups in different rows corresponding to each other in a column direction are connected to one same data line; and
the compensation driving circuits which are corresponding to second compensation light emitting groups in different rows corresponding to each other in the column direction are connected to another one same data line,
wherein the one compensation driving circuit connected to the one sub-pixel unit of each of the at least one second compensation light emitting group only is connected to one sub-pixel unit,
in odd rows of the sub-pixel units, the second compensation light emitting group is at a first end in a row direction,
in even rows of the sub-pixel units, the second compensation light emitting group is at a second end in the row direction, and
the first end and the second end are opposite to each other,
wherein in each row of the sub-pixel units, only one second compensation light emitting group is disposed.

* * * * *